US009165678B2

(12) United States Patent
Jeong

(10) Patent No.: US 9,165,678 B2
(45) Date of Patent: Oct. 20, 2015

(54) SEMICONDUCTOR MEMORY DEVICE AND METHOD FOR OPERATING THE SAME

(71) Applicant: SK hynix Inc., Gyeonggi-do (KR)

(72) Inventor: Chun-Seok Jeong, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 7 days.

(21) Appl. No.: 14/286,688

(22) Filed: May 23, 2014

(65) Prior Publication Data

US 2015/0170761 A1 Jun. 18, 2015

(30) Foreign Application Priority Data

Dec. 18, 2013 (KR) .......................... 10-2013-0158543

(51) Int. Cl.
*G11C 29/00* (2006.01)
(52) U.S. Cl.
CPC ...................................... *G11C 29/00* (2013.01)
(58) Field of Classification Search
None
See application file for complete search history.

(56) References Cited

U.S. PATENT DOCUMENTS

2009/0040851 A1* 2/2009 Mori et al. ..................... 365/201

FOREIGN PATENT DOCUMENTS

KR 1020040034168 4/2004

* cited by examiner

*Primary Examiner* — James G Norman
(74) *Attorney, Agent, or Firm* — IP & T Group LLP

(57) ABSTRACT

A semiconductor memory device includes an operation control block suitable for controlling an entrance/escape to/from a test public mode and a test application mode in response to a first preset command and an address signal that is inputted through an address pad, a test normal input block suitable for receiving the address signal as a test operation signal in response to the first preset command in the test application mode, a test public input block suitable for receiving a data signal, which is inputted through a data pad as the test operation signal in response to a second preset command in the test public mode, and an internal circuit suitable for performing a preset test operation in response to the test operation signal in the test application mode.

22 Claims, 8 Drawing Sheets

SEMICONDUCTOR MEMORY DEVICE AND METHOD FOR OPERATING THE SAME

CROSS-REFERENCE TO RELATED APPLICATIONS

The present application claims priority of Korean Patent Application No. 10-2013-0158543, filed on Dec. 18, 2013, which is incorporated herein by reference in its entirety.

BACKGROUND

1. Field

Exemplary embodiments of the present invention relate to a semiconductor design technology, and more particularly, to a semiconductor memory device that supports a test mode accessible from the exterior.

2. Description of the Related Art

A synchronous semiconductor memory device uses a mode register and a mode register set (MRS). The mode register programs and stores data for controlling various operation modes of the synchronous semiconductor memory device.

The operation modes or characteristics of a conventional semiconductor memory device are decided by an inputted control signal. However, in the synchronous semiconductor memory device, a central processing unit (CPU) presets an operation mode of the synchronous semiconductor memory device to be used later, that is, CAS latency (column address strobe latency) or a burst length, and accesses the synchronous semiconductor memory device. Such an operation mode is set and stored in the mode register, and a set of a series of mode registers is called a mode register set (MRS). Accordingly, a series of codes indicating the modes of a semiconductor memory device are set in the mode register set, wherein such codes are called MRS (mode register set) codes.

Conventionally, the MRS codes are generated by a combination of addresses. The MRS codes are generated by the combination of addresses and respective operation modes of a semiconductor memory device are decided corresponding to the generated MRS codes. Such MRS codes are standardized by JEDEC. MRS codes for testing a semiconductor memory device designed in a semiconductor design process are necessary, which are called test MRS codes.

FIG. 1 is a table of MRS codes of a semiconductor memory device according to the conventional art.

Referring to FIG. 1, table values of the MRS codes are decided by a combination of signals applied through address pads BA2 to BA0 and A15 to A0.

In detail, among the signals inputted through the address pads BA2 to BA0 and A15 to A0, a signal TM of the address pad A7 is used in order to control entrance to a test mode of the semiconductor memory device. That is, the semiconductor memory device performs a normal operation when the value of the signal TM is '0', and performs a test mode operation when the value of the signal TM is '1'.

When the value of the signal TM is '1' and the semiconductor memory device performs the test mode operation, methods for inputting test operation codes used in a test mode to the semiconductor memory device differ between fabricating companies of the semiconductor memory device. That is, since detailed internal operations of the semiconductor memory device differ between the fabricating companies and methods for testing the operations are very complicated, the test methods performed on the semiconductor memory device are not accessible from the exterior of the semiconductor memory device.

As many functions are added to the semiconductor memory device, including timing adjustments and the like, to obtain high speed operation, it is highly necessary for an external semiconductor controller or user to perform specific common test functions of the semiconductor memory device. However, since semiconductor companies are concerned with security and compete to guarantee product operation, test mode operation methods necessary for development and testing are kept in secret and not generally open to the public. It is highly probable that defining a specific function or timing through a separate specification (SPEC.), by using MRS codes for the release, faces limitations when considering the growing types of necessary test modes. [Revised the paragraph to improve clarity. Please verify. Thank you.]

In this regard, it is necessary to provide a method for allowing an external semiconductor controller or user to access some internal test mode operations that may be open in the range of the specification (SPEC.) of a semiconductor memory device.

SUMMARY

Various embodiments of the present invention are directed to a semiconductor memory device that supports a test mode accessible from the exterior and a method for operating the same.

In an embodiment, a semiconductor memory device may include: an operation control block suitable for controlling an entrance/escape to/from a test public mode and a test application mode in response to a first preset command and an address signal that is inputted through an address pad; a test normal input block suitable for receiving the address signal as a test operation signal in response to the first preset command in the test application mode; a test public input block suitable for receiving a data signal, which is inputted through a data pad, as the test operation signal in response to a second preset command in the test public mode; and an internal circuit suitable for performing a preset test operation in response to the test operation signal in the test application mode.

In another embodiment, a method for operating a semiconductor memory device may include: entering a test application mode based on an address signal that is inputted through an address pad in response to a first preset command after power-up; escaping from the test application mode and entering a test public mode based on the address signal in response to the first preset command in the test application mode; generating a test operation signal based on a data signal that is inputted through a data pad in response to a second preset command in the test public mode; escaping from the test public mode and entering the test application mode based on the address signal in response to the first preset command in the test public mode; and applying a preset test operation to an internal circuit in response to the test operation signal in the test application mode.

In a further embodiment, a semiconductor memory device may include: an operation control block suitable for generating a test application signal and a test public mode signal indicating a test application mode and a test public mode, respectively, in response to a first command and an address signal inputted through an address pad in response to the first command; a test normal input block suitable for generating a test operation signal based on the address signal in response to the test application signal; a test public input block suitable for generating the test operation signal based on a data signal, which is inputted through a data pad in response to a second command, in response to the test public mode signal; and an internal circuit suitable for performing a test operation in response to the test operation signal.

A semiconductor memory device may enter a public test mode under the control of an exterior source and perform a test mode operation through a normal memory access protocol such as a data input operation.

DETAILED DESCRIPTION

Figure 1:
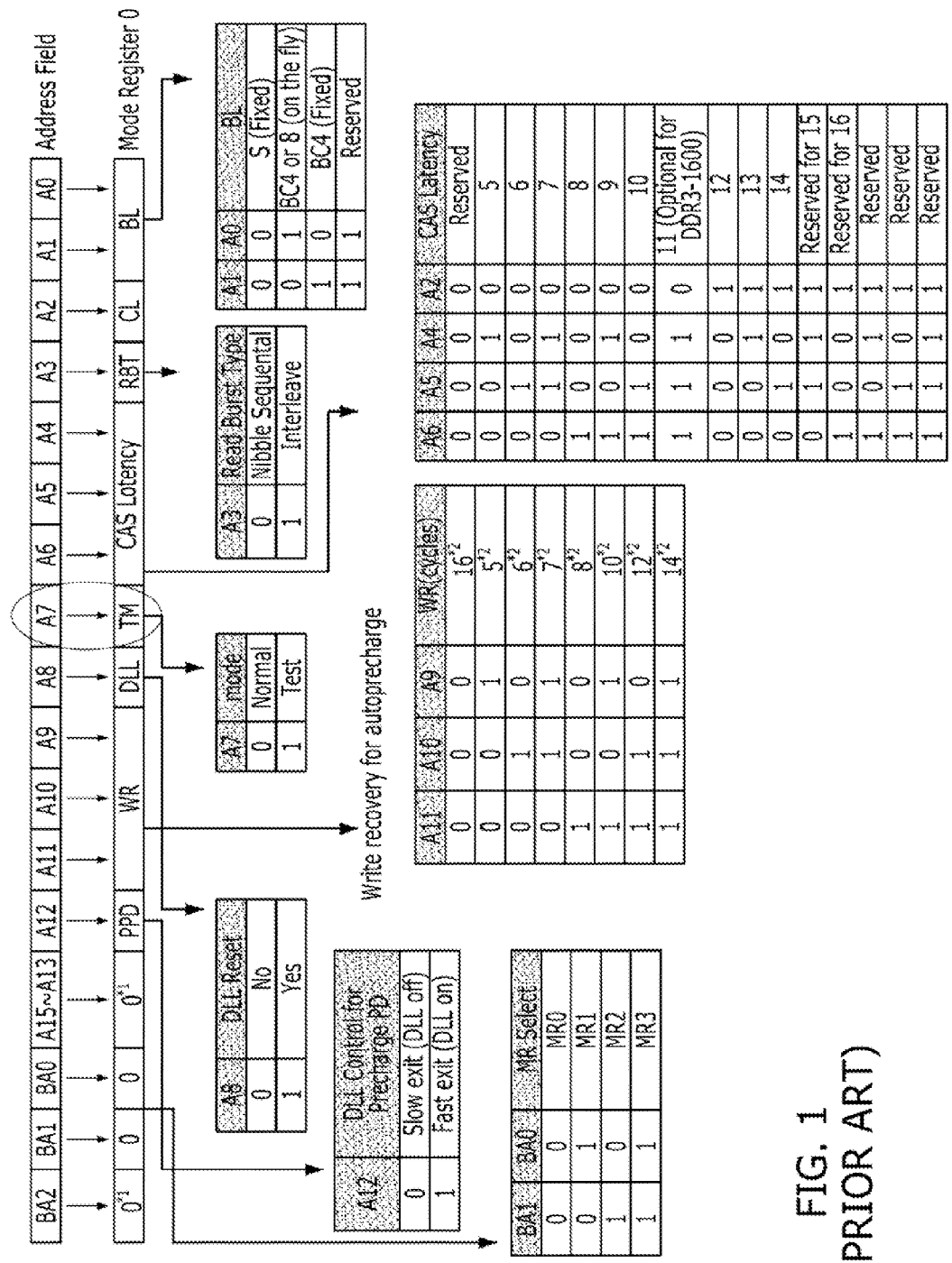
FIG. 1 is a table of MRS codes of a semiconductor memory device according to the conventional art.

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and in some instances, proportions may have been exaggerated in order to clearly illustrate features of the embodiments. When a first layer is referred to as being "on" a second layer or "on" a substrate, it not only refers to a case where the first layer is formed directly on the second layer or the substrate but also a case where a third layer exists between the first layer and the second layer or the substrate.

Figure 2:
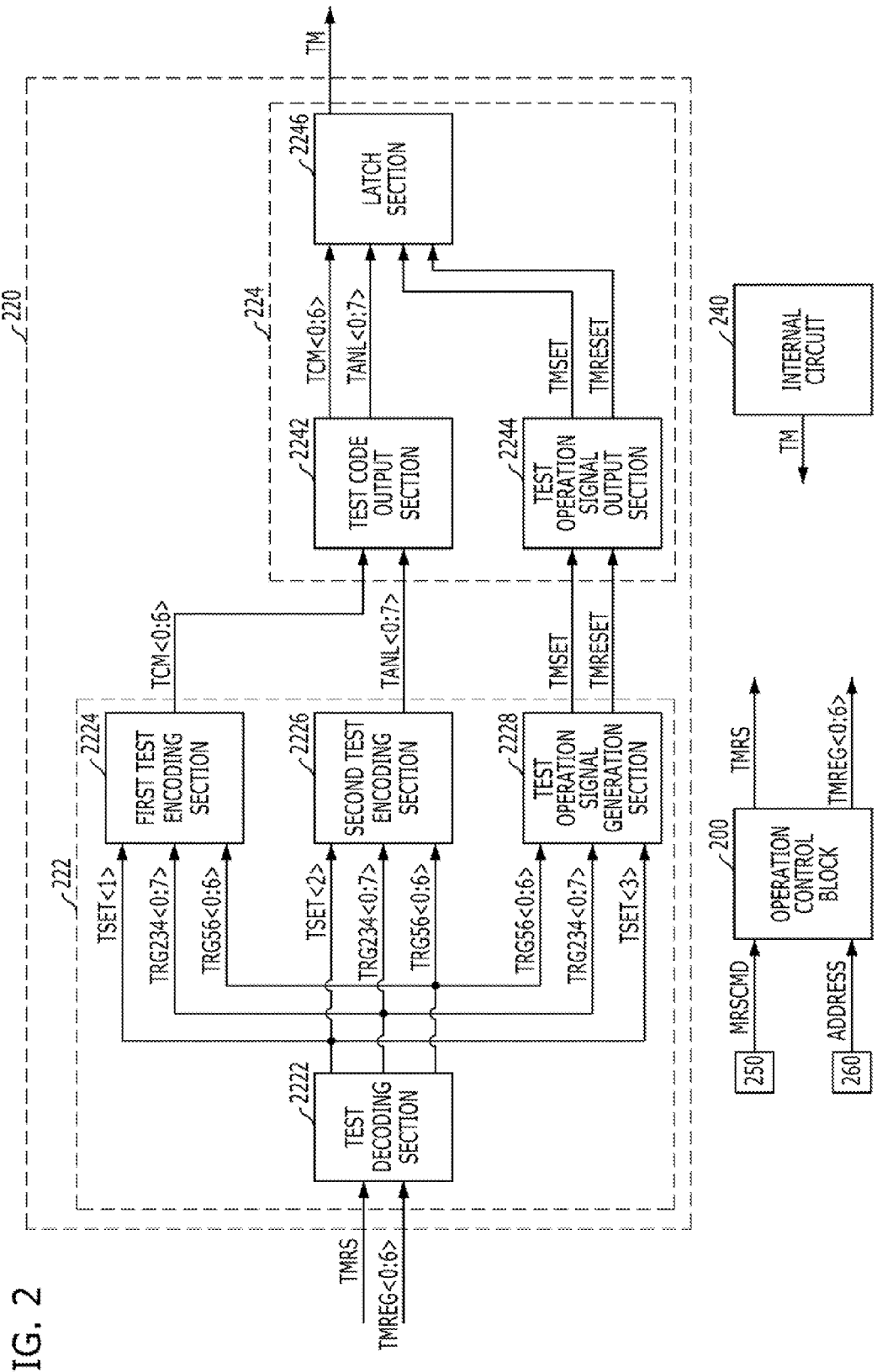
FIG. 2 is a block diagram illustrating the configuration of a circuit that performs a test mode operation using a MRS code in a general semiconductor memory device.

FIG. 2 is a block diagram illustrating the configuration of a circuit that performs a test mode operation using a MRS code in a general semiconductor memory device.

Referring to FIG. 2, the circuit that performs the test mode operation using the MRS code in the general semiconductor memory device includes an operation control block 200, a test input block 220, and an internal circuit 240. The test input block 220 includes a test signal generation unit 222 and a test application unit 224. The test signal generation unit 222 includes a test decoding section 2222, a first test encoding section 2224, a second test encoding section 2226, and a test operation signal generation section 2228. The test application unit 224 includes a test code output section 2242, a test operation signal output section 2244, and a latch section 2246.

The operation control block 200 generates a test application signal TMRS and test selection signals TMREG<0:6> for controlling an operation of a test application mode in response to a MRS command MRSCMD inputted through a command pad 250 and an address signal ADDRESS inputted through an address pad 260. The test application signal TMRS is used to control entrance/escape to/from the test application mode. That is, in a period in which the test application signal TMRS is activated, the operation control block 200 enters the test application mode, and in a period in which the test application signal TMRS is deactivated, the operation control block 200 escapes from the test application mode. The test selection signals TMREG<0:6> are used to select a test operation in the entrance period of the test application mode. At this time, the test selection signals TMREG<0:6> are applied to the test input block 220 and are used to determine whether to activate a test operation signal TM.

The test input block 220 receives the address signal ADDRESS, which is inputted through an address pad 260, as the test operation signal TM in response to the MRS command MRSCMD, which is inputted through the command pad 250, in the state in which the operation control block 200 has entered the test application mode. At this time, since the address signal ADDRESS is decoded as the test selection signals TMREG<0:6> by the operation control block 200, it is noted that the test input block 220 performs an operation for receiving the test selection signals TMREG<0:6> and determining whether to activate the test operation signal TM.

Between the elements of the test input block 220, the test signal generation unit 222 selectively generates test normal signals TCM<0:6> and TANL<0:7> or test setting signals TMSET and TMRESET based on the address signal ADDRESS, which is inputted through the address pad 260, in response to the MRS command MRSCMD, which is inputted through the command pad 250, in the state in which the operation control block 200 has entered the test application mode. That is, the test signal generation unit 222 generates the test normal signals TCM<0:6> and TANL<0:7> or the test setting signals TMSET and TMRESET based on the test selection signals TMREG<0:6>, which are inputted in response to the MRS command MRSCMD, in the state in which the test application signal TMRS has been activated and the operation control block 200 has entered the test application mode. The test setting signals TMSET and TMRESET are not generated at the time point at which the test normal signals TCM<0:6> and TANL<0:7> are generated, and the test normal signals TCM<0:6> and TANL<0:7> are not generated at the time point at which the test setting signals TMSET and TMRESET are generated. For example, when the MRS command MRSCMD is sequentially inputted twice, the test normal signals TCM<0:6> and TANL<0:7> are generated based on the test selection signals TMREG<0:6> inputted in response to the first MRS command MRSCMD, and at this time point, the test setting signals TMSET and TMRESET are not generated. Then, the test setting signals TMSET and TMRESET are generated based on the test selection signals TMREG<0:6> inputted in response to the second MRS command MRSCMD, and at this time point, the test normal signals TCM<0:6> and TANL<0:7> are not generated.

Among the elements of the test signal generation unit 222, the test decoding section 2222 decodes the test selection signals TMREG<0:6> in the state in which the test application signal TMRS has been activated, and generates signal selection setting signals TSET<1:3>, first test selection signals TRG234<0:7>, and second test selection signals TRG56<0:6>.

Among the elements of the test signal generation unit 222, the first test encoding section 2224 generates test normal upper signals TCM<0:6> in response to a first signal TSET<1> of the signal selection setting signals TSET<1:3>, the first test selection signals TRG234<0:7>, and the second test selection signals TRG56<0:6>.

Among the elements of the test signal generation unit 222, the second test encoding section 2226 generates test normal lower signals TANL<0:7> in response to a second signal TSET<2> of the signal selection setting signals TSET<1:3>, the first test selection signals TRG234<0:7>, and the second test selection signals TRG56<0:6>.

Among the elements of the test signal generation unit 222, the test operation signal generation section 2228 generates the test setting signals TMSET and TMRESET in response to a third signal TSET<3> of the signal selection setting signals TSET<1:3>, the first test selection signals TRG234<0:7>, and the second test selection signals TRG56<0:6>.

In the configuration of the aforementioned test signal generation unit 222, the test selection signals TMREG<0:6> are decoded/divided into the first test selection signals TRG234<0:7> and the second test selection signals TRG56<0:6> to be encoded separately, so that many test operations are selected using a MRS code of limited bits. That is, the detailed configuration of the aforementioned test signal generation unit 222 is an illustrative example only, and it may be realized by different schemes in an actual semiconductor memory device, in order to decode/encode the address signal ADDRESS inputted through the address pad 260.

Between the elements of the test input block 220, the test application unit 224 outputs the test normal signals TCM<0:6> and TANL<0:7> as the test operation signal TM in response to a test set signal TMSET of the test setting signals TMSET and TMRESET in the state in which the operation control block 200 has entered the test application mode.

Among the elements of the test application unit 224, the test code output section 2242 receives the test normal signals TCM<0:6> and TANL<0:7> generated from the test signal generation unit 222, and stores the test normal signals TCM<0:6> and TANL<0:7> in the latch section 2246.

Among the elements of the test application unit 224, the test operation signal output section 2244 receives the test setting signals TMSET and TMRESET generated from the test signal generation unit 222, and controls the operation of the latch section 2246.

Among the elements of the test application unit 224, the latch section 2246 latches the test normal signals TCM<0:6> and TANL<0:7>. The latch section 2246 determines whether to activate the test operation signal TM based on the latched test normal signals TCM<0:6> and TANL<0:7> in response to the test set signal TMSET of the test setting signals TMSET and TMRESET. The latch section 2246 is initialized in response to a test initialization signal TMRESET of the test setting signals TMSET and TMRESET.

The internal circuit 240 performs a preset test operation in response to the test operation signal TM.

FIG. 2 illustrates that one internal circuit performs a test operation in response to the test operation signal TM. However, this is for illustrative examples only. Actually, a plurality of internal circuits 240 are included in the semiconductor memory device, and a plurality of test operation signals TM for performing a test operation are used in the respective internal circuits 240. That is, FIG. 2 illustrates the configuration of receiving the address signal ADDRESS and generating one test operation signal TM. This is for simplifying the operation for receiving the address signal ADDRESS and determining whether to activate one of the plurality of test operation signals TM. Accordingly, in an actual semiconductor memory device, a plurality of circuits such as the test input block 220 commonly receive the address signal ADDRESS and activate some of the plurality of test operation signals TM and deactivate the others of the plurality of test operation signals TM based on values of the address signal ADDRESS.

Figure 3:
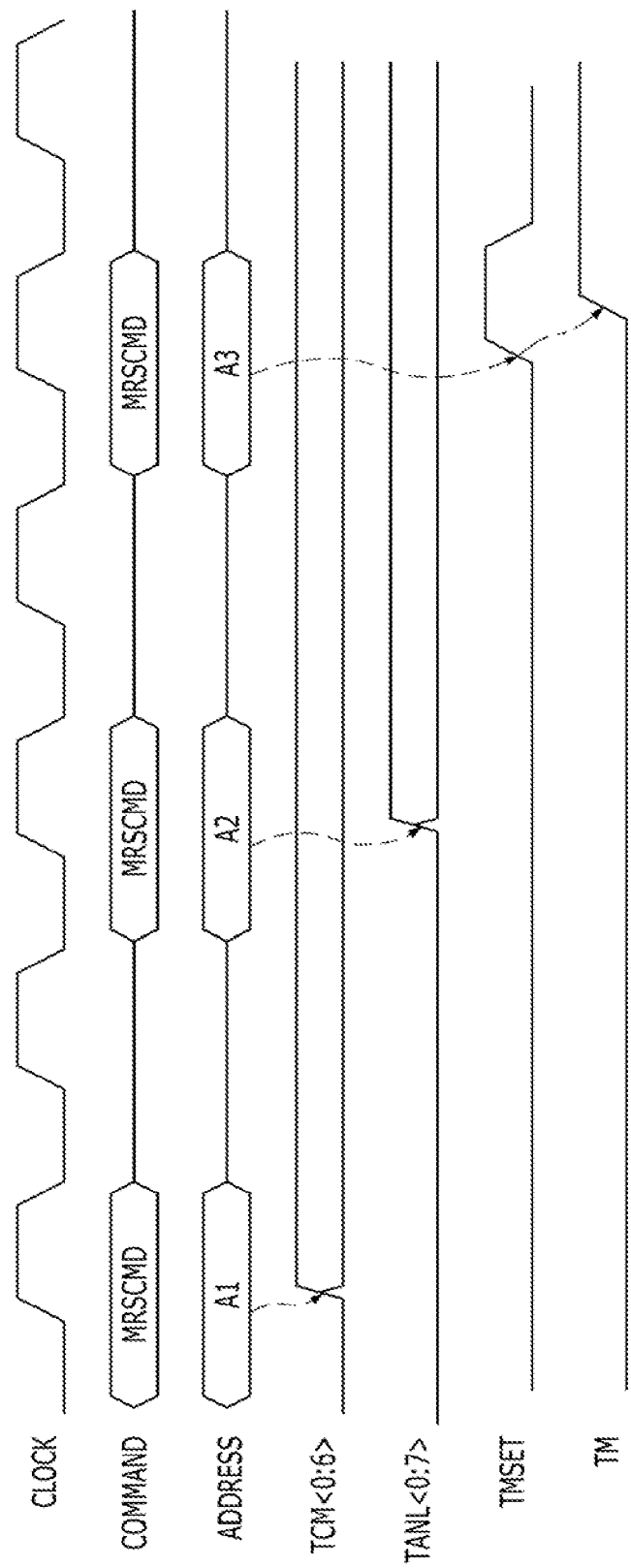
FIG. 3 is a timing diagram for explaining the operation of a circuit that performs a test mode operation using a MRS code in a general semiconductor memory device illustrated in FIG. 2.

FIG. 3 is a timing diagram for explaining the operation of the circuit that performs the test mode operation using the MRS code in the general semiconductor memory device illustrated in FIG. 2.

Referring to FIG. 3, it is noted that, in the circuit that performs the test mode operation using the MRS code in the general semiconductor memory device, the MRS command MRSCMD is sequentially inputted a number of times, and the operation of the test application mode is decided depending on the values of the address signal ADDRESS in response to the respective MRS commands MRSCMD.

In detail, the address signal ADDRESS inputted in response to the first MRS command MRSCMD has a value of 'A1'. Accordingly, the test input block 220 sets values of the test normal upper signals TCM<0:6>. At this time point, values of the test normal lower signals TANL<0:7> are not set. The set values of the test normal upper signals TCM<0:6> are stored in the latch section 2246 and are substantially maintained as is in a next operation.

Then, the address signal ADDRESS inputted in response to the second MRS command MRSCMD has a value of 'A2'. Accordingly, the test input block 220 sets values of the test normal lower signals TANL<0:7>. At this time point, the set values of the test normal upper signals TCM<0:6> are not affected. The set values of the test normal lower signals TANL<0:7> are stored in the latch section 2246 together with the test normal upper signals TCM<0:6>, and are substantially maintained as is in a next operation.

As described above, the address signal ADDRESS is inputted through the address pad 260 in several steps in response to the MRS commands MRSCMD. That is, in order to receive the test normal signals TCM<0:6> and TANL<0:7> including a relatively large number of bits as compared with the address signal ADDRESS, the address signal ADDRESS is inputted in several steps. FIG. 3 illustrates that the address signal ADDRESS is inputted in two steps. However, this is for illustrative purposes only. The address signal ADDRESS may be inputted in a larger number of steps or a smaller number of steps.

Then, the address signal ADDRESS inputted in response to the third MRS command MRSCMD has a value of 'A3'. Accordingly, the test input block 220 pulses the test set signal TMSET of the test setting signals TMSET and TMRESET. At this time point, whether to activate the test operation signal TM is determined in response to the test normal signals TCM<0:6> and TANL<0:7> having the set values stored in the latch section 2246. FIG. 3 illustrates that the test normal signals TCM<0:6> and TANL<0:7> stored in the latch section 2246 activate the test operation signal TM, and only some of the plurality of test operation signals TM are in an activated state as illustrated in FIG. 3.

FIG. 3 illustrates only the state in which the semiconductor memory device has already entered the test application mode. That is, before the operation illustrated in FIG. 3 is performed, the address signal ADDRESS may be inputted in response to the MRS command MRSCMD and have values other than the 'A1', the 'A2', and the 'A3' illustrated in FIG. 3, and the test application signal TMRS may be activated in response to the address signal ADDRESS. The semiconductor memory device may enter the test application mode. Of course, at the time point at which the semiconductor memory device enters the test application mode, the test initialization signal TMRESET of the test setting signals TMSET and TMRESET may be pulsed to initialize the test input block 220.

Figure 4:
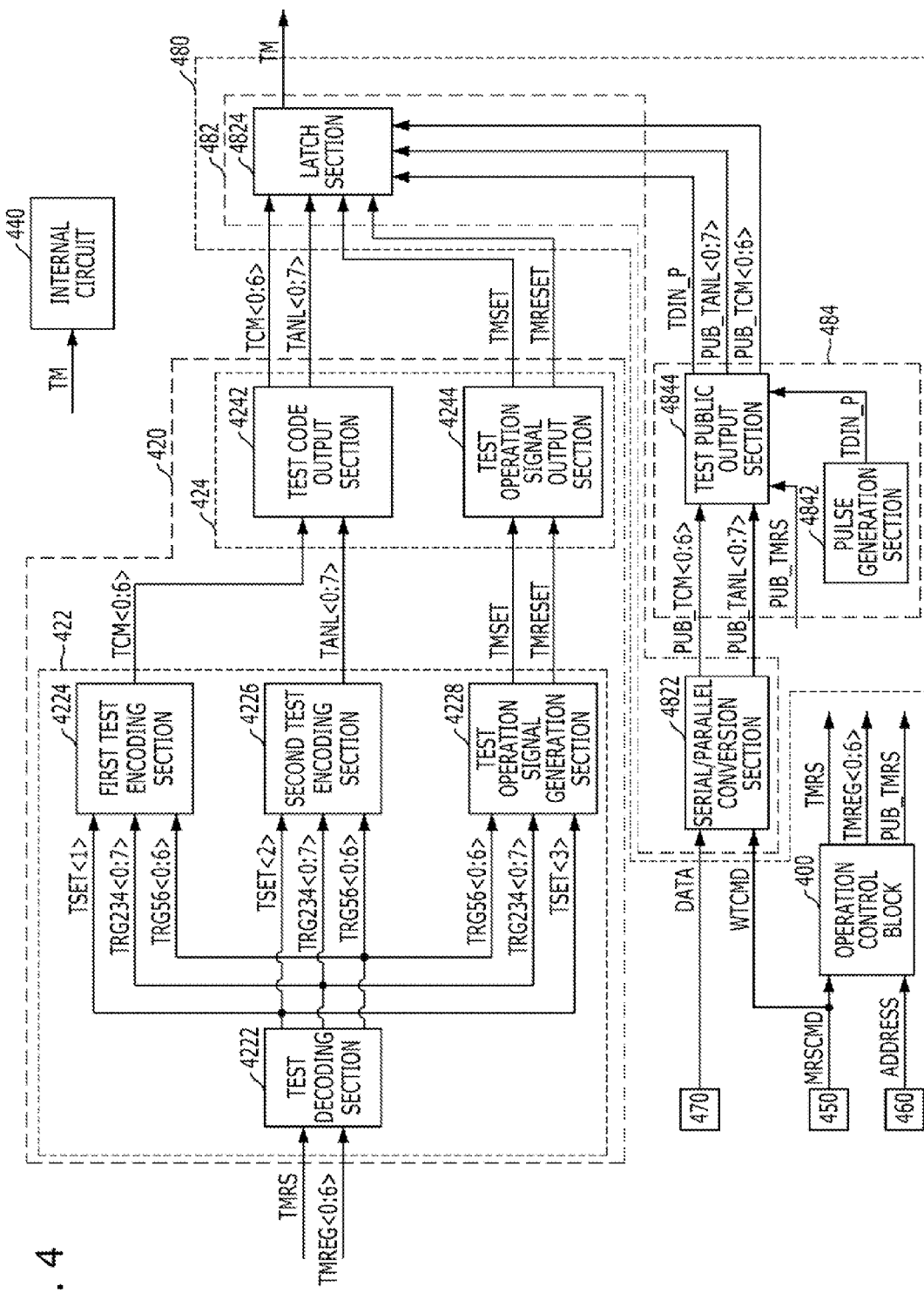
FIG. 4 is a block diagram illustrating the configuration of a circuit that performs a test mode operation using a MRS code in a semiconductor memory device in accordance with an embodiment of the present invention.

FIG. 4 is a block diagram illustrating the configuration of a circuit that performs a test mode operation using a MRS code in a semiconductor memory device in accordance with an embodiment of the present invention.

Referring to FIG. 4, the circuit that performs the test mode operation using the MRS code in the semiconductor memory device in accordance with the embodiment of the present invention includes an operation control block 400, a test normal input block 420, a test public input block 480, and an internal circuit 440. The test public input block 480 includes a test public signal generation unit 482 and a test public application unit 484. The test public signal generation unit 482 includes a serial/parallel conversion section 4822 and a latch section 4824. The test public application unit 484 includes a pulse generation section 4842 and a test public output section 4844. The test normal input block 420 includes a test normal signal generation unit 422 and a test normal application unit 424. The test normal signal generation unit 422 includes a test decoding section 4222, a first test encoding section 4224, a second test encoding section 4226, and a test operation signal generation section 4228. The test normal application unit 424 includes a test code output section 4242 and a test operation signal output section 4244.

The operation control block 400 generates a test application signal TMRS and test selection signals TMREG<0:6> for controlling an operation of a test application mode, and a test public mode signal PUB_TMRS for controlling an operation of a test public mode in response to a MRS command MRSCMD inputted through a command pad 450 and an address signal ADDRESS inputted through an address pad 460. The test application signal TMRS is used to control entrance/escape to/from the test application mode. That is, in a period in which the test application signal TMRS is activated, the operation control block 400 enters the test application mode, and in a period in which the test application signal TMRS is deactivated, the operation control block 400 escapes from the test application mode. The test selection signals TMREG<0:6> are used to select a test operation in the entrance period of the test application mode. At this time, the test selection signals TMREG<0:6> are applied to the test normal input block 420 and are used to determine whether to activate a test operation signal TM. The test public mode signal PUB_TMRS is used to control entrance/escape to/from the test public mode. That is, in a period in which the test public mode signal PUB_TMRS is activated, the operation control block 400 enters the test public mode, and in a period in which the test public mode signal PUB_TMRS is deactivated, the operation control block 400 escapes from the test public mode.

Hereinafter, a method, in which the operation control block 400 enters/escapes to/from the test application mode and the test public mode, will be described as follows. After power-up, when the address signal ADDRESS inputted through the address pad 460 in response to the MRS command MRSCMD has a preset first value, the operation control block 400 enters the test application mode. When the address signal ADDRESS inputted through the address pad 460 in response to the MRS command MRSCMD in the test application mode entrance period has a preset second value, the operation control block 400 escapes from the test application mode and enters the test public mode. When the address signal ADDRESS inputted through the address pad 460 in response to the MRS command MRSCMD in the test public mode entrance period has a preset third value, the operation control block 400 escapes from the test public mode and enters the test application mode. When the address signal ADDRESS inputted through the address pad 460 in response to the MRS command MRSCMD in the test application mode entrance period has a preset fourth value, the operation control block 400 escapes from the test application mode. As described above, whether to enter the test public mode only may be determined in the state in which the operation control block 400 has entered the test application mode.

The test public input block 480 receives a data signal DATA, which is inputted through a data pad 470, as the test operation signal TM in response to a write command WTCMD, which is inputted through the command pad 450, in the state in which the operation control block 400 has entered the test public mode.

Between the elements of the test public input block 480, the test public signal generation unit 482 generates test public signals PUB_TCM<0:6> and PUB_TANL<0:7> in response to the data signal DATA, which is inputted through the data pad 470, and the write command WTCMD in the state in which the operation control block 400 has entered the test public mode.

Between the elements of the test public signal generation unit 482, the serial/parallel conversion section 4822 parallelizes the data signal DATA, which is serially inputted through the data pad 470, in response to the write command WTCMD in the state in which the operation control block 400 has entered the test public mode, and generates the test public signals PUB_TCM<0:6> and PUB_TANL<0:7>. The serial/parallel conversion section 4822 may be separately included in the semiconductor memory device for the operation of the test public mode, or a serial/parallel conversion circuit included in the semiconductor memory device for an input/output operation of general burst data may be used as is.

Between the elements of the test public signal generation unit 482, the latch section 4824 latches the test public signals PUB_TCM<0:6> and PUB_TANL<0:7>, which are outputted from the test public application unit 484 in a parallel manner, in the state in which the operation control block 400 has entered the test public mode. The latch section 4824 latches test normal signals TCM<0:6> and TANL<0:7>, which are generated in the test normal input block 420 in the state in which the operation control block 400 has entered the test application mode. That is, the latch section 4824 stores the test normal signals TCM<0:6> and TANL<0:7> in the state in which the operation control block 400 has entered the test application mode, thereby determining whether to activate the test operation signal TM. Furthermore, the latch section 4824 stores the test public signals PUB_TCM<0:6> and PUB_TANL<0:7> in the state in which the operation control block 400 has entered the test public mode, thereby determining whether to activate the test operation signal TM.

Of course, in the state in which the operation control block 400 has entered the test application mode, the operation of the latch section 4824 is controlled by test setting signals TMSET and TMRESET, and in the state in which the operation control block 400 has entered the test public mode, the operation of the latch section 4824 is controlled by an input completion pulse TDIN_P. Furthermore, the latch section 4824 is initialized in response to a test initialization signal TMRESET of the test setting signals TMSET and TMRESET.

Between the elements of the test public input block 480, the test public application unit 484 controls the latch section 4824 which outputs the test public signals PUB_TCM<0:6> and PUB_TANL<0:7> as the test operation signal TM at the time point at which a preset time lapses from the time point at which the operation of the test public signal generation unit 482 ends in the state in which the operation control block 400 has entered the test public mode.

Between the elements of the test public application unit 484, the pulse generation section 4842 generates the input completion pulse TDIN_P that is pulsed at the time point at which a preset time lapses after the data signal DATA is serially inputted from the data pad 470 to the serial/parallel conversion section 4822 in the state in which the operation control block 400 has entered the test public mode. At this time, the time point, at which the data signal DATA is serially inputted from the data pad 470 to the serial/parallel conversion section 4822, and the time point at which the input completion pulse TDIN_P that is pulsed, may be recognized by setting the number of bits of the data signal DATA serially inputted in synchronization with a clock CLOCK in response to the write command WTCMD in advance. For example, the pulse generation section 4842 may operate by pulsing the input completion pulse TDIN_P at the time point at which one cycle 1tck of the clock CLOCK passes after the data signal DATA of 8 bits synchronized with the clock CLOCK is serially inputted in response to the write command WTCMD.

Between the elements of the test public application unit 484, the test public output section 4844 controls the latch section 4824 which outputs the test public signals PUB_TCM<0:6> and PUB_TANL<0:7> latched in the latch section 4824 as the test operation signal TM in response to the toggling of the input completion pulse TDIN_P.

The test normal input block 420 receives the address signal ADDRESS, which is inputted through the address pad 460, as the test operation signal TM in response to the MRS command MRSCMD, which is inputted through the command pad 450, in the state in which the operation control block 400 has entered the test application mode. At this time, since the address signal ADDRESS is decoded as the test selection signals TMREG<0:6> by the operation control block 400, it is noted that the test normal input block 420 performs an operation for receiving the test selection signals TMREG<0:6> and determining whether to activate the test operation signal TM.

Between the elements of the test normal input block 420, the test normal signal generation unit 422 selectively generates the test normal signals TCM<0:6> and TANL<0:7> or the test setting signals TMSET and TMRESET based on the address signal ADDRESS, which is inputted through the address pad 460, in response to the MRS command MRSCMD, which is inputted through the command pad 450, in the state in which the operation control block 400 has entered the test application mode. That is, the test normal signal generation unit 422 generates the test normal signals TCM<0:6> and TANL<0:7> or the test setting signals TMSET and TMRESET based on the test selection signals TMREG<0:6>, which are inputted in response to the MRS command MRSCMD, in the state in which the test application signal TMRS has been activated and the operation control block 400 has entered the test application mode. The test setting signals TMSET and TMRESET are not generated at the time point at which the test normal signals TCM<0:6> and TANL<0:7> are generated, and the test normal signals TCM<0:6> and TANL<0:7> are not generated at the time point at which the test setting signals TMSET and TMRESET are generated. For example, when the MRS command MRSCMD is sequentially inputted twice, the test normal signals TCM<0:6> and TANL<0:7> are generated based on the test selection signals TMREG<0:6> inputted in response to the first MRS command MRSCMD, and at this time point, the test setting signals TMSET and TMRESET are not generated. Then, the test setting signals TMSET and TMRESET are generated based on the test selection signals TMREG<0:6> inputted in response to the second MRS command MRSCMD, and at this time point, the test normal signals TCM<0:6> and TANL<0:7> are not generated.

Among the elements of the test normal signal generation unit 422, the test decoding section 4222 decodes the test selection signals TMREG<0:6> in the state in which the test application signal TMRS has been activated, and generates signal selection setting signals TSET<1:3>, first test selection signals TRG234<0:7>, and second test selection signals TRG56<0:6>.

Among the elements of the test normal signal generation unit 422, the first test encoding section 4224 generates test normal upper signals TCM<0:6> in response to a first signal TSET<1> of the signal selection setting signals TSET<1:3>, the first test selection signals TRG234<0:7>, and the second test selection signals TRG56<0:6>.

Among the elements of the test normal signal generation unit 422, the second test encoding section 4226 generates test normal lower signals TANL<0:7> in response to a second signal TSET<2> of the signal selection setting signals TSET<1:3>, the first test selection signals TRG234<0:7>, and the second test selection signals TRG56<0:6>.

Among the elements of the test normal signal generation unit 422, the test operation signal generation section 4228 generates the test setting signals TMSET and TMRESET in response to a third signal TSET<3> of the signal selection setting signals TSET<1:3>, the first test selection signals TRG234<0:7>, and the second test selection signals TRG56<0:6>.

In the configuration of the aforementioned test normal signal generation unit 422, the test selection signals TMREG<0:6> are decoded/divided into the first test selection signals TRG234<0:7> and the second test selection signals TRG56<0:6> to be encoded separately, so that many test operations are selected using a MRS code of limited bits. That is, the detailed configuration of the aforementioned test normal signal generation unit 422 is for illustrative purposes only, and it may be realized by different schemes in an actual semiconductor memory device, in order to decode/encode the address signal ADDRESS inputted through the address pad 460.

Between the elements of the test input block 420, the test normal application unit 424 controls the latch section 4824 which outputs the test normal signals TCM<0:6> and TANL<0:7> as the test operation signal TM in response to a test set signal TMSET of the test setting signals TMSET and TMRESET in the state in which the operation control block 400 has entered the test application mode.

Among the elements of the test normal application unit 424, the test code output section 4242 receives the test normal signals TCM<0:6> and TANL<0:7> generated from the test normal signal generation unit 422, and stores the test normal signals TCM<0:6> and TANL<0:7> in the latch section 4824.

Among the elements of the test normal application unit 424, the test operation signal output section 4244 receives the test setting signals TMSET and TMRESET generated from the test normal signal generation unit 422, and controls the operation of the latch section 4824 in the state in which the operation control block 400 has entered the test application mode.

The internal circuit 440 performs a preset test operation in response to the test operation signal TM.

FIG. 4 illustrates that one internal circuit performs a test operation in response to the test operation signal TM. However, this is for illustrative purposes only. Actually, a plurality of internal circuits 440 are included in the semiconductor memory device, and a plurality of test operation signals TM for performing a test operation are used in the respective internal circuits 440. That is, FIG. 4 illustrates the configuration of receiving the address signal ADDRESS or the data signal DATA and generating one test operation signal TM. This is for simplifying an operation for receiving the address signal ADDRESS or the data signal DATA and determining whether to activate one of the plurality of test operation signals TM. Accordingly, in an actual semiconductor memory device, a plurality of circuits such as the test normal input block 420 and the test public input block 480 commonly receive the address signal ADDRESS or the data signal DATA, and activate some of the plurality of test operation signals TM and deactivate the others of the plurality of test operation signals TM based on values of the address signal ADDRESS or the data signal DATA.

Figure 5:
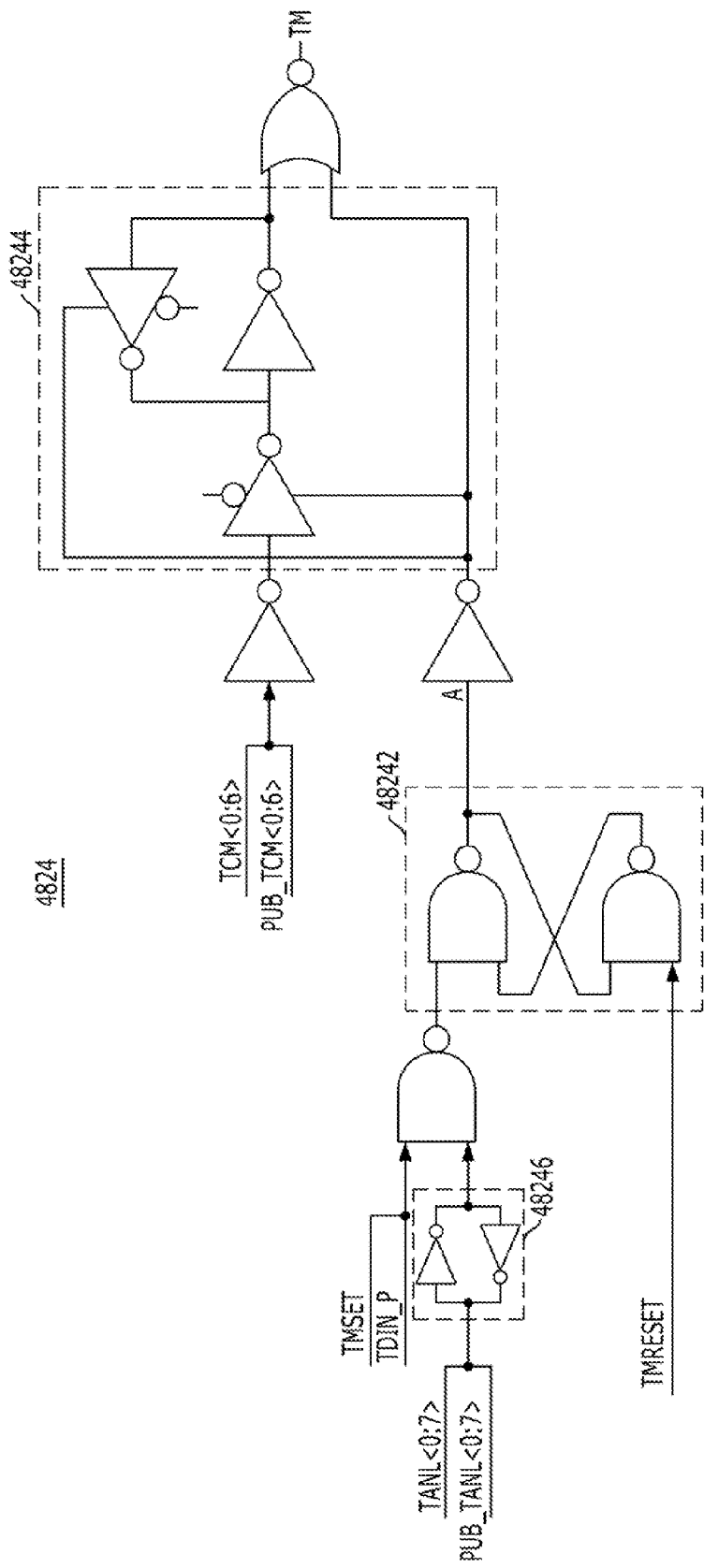
FIG. 5 is a circuit diagram illustrating the detailed configuration of a latch section of elements of a circuit that performs a test mode operation using a MRS code in a semiconductor memory device illustrated in FIG. 4 in accordance with an embodiment of the present invention.

FIG. 5 is a circuit diagram illustrating the detailed configuration of the latch section of the elements of the circuit that performs the test mode operation using the MRS code in the semiconductor memory device illustrated in FIG. 4 in accordance with the embodiment of the present invention.

In detail, the latch section 4824 includes internal latches 48244 and 48246 and an SR latch 48242.

The internal latches 48244 and 48246 selectively receive and store the test public signals PUB_TCM<0:6> and PUB_TANL<0:7> or the test normal signals TCM<0:6> and TANL<0:7> depending on an operation mode. That is, in the state in which the operation control block 400 has entered the test public mode, the internal latches 48244 and 48246 receive and store the test public signals PUB_TCM<0:6> and PUB_TANL<0:7> that are outputted from the test public application unit 484 in a parallel manner. In the state in which the operation control block 400 has entered the test application mode, the internal latches 48244 and 48246 receive and store the test normal signals TCM<0:6> and TANL<0:7> generated from the test normal input block 420.

The SR latch 48242 selectively responds to the test setting signals TMSET and TMRESET or the input completion pulse TDIN_P depending on an operation mode, and outputs the test public signals PUB_TCM<0:6> and PUB_TANL<0:7> or the test normal signals TCM<0:6> and TANL<0:7>, which have been stored in the internal latches 48244 and 48246, as the test operation signal TM. That is, in the state in which the operation control block 400 has entered the test application mode, the SR latch 48242 is initialized in response to the test initialization signal TMRESET of the test setting signals TMSET and TMRESET generated from the test normal input block 420. In the state in which the operation control block 400 has entered the test application mode, the SR latch 48242 outputs the test normal signals TCM<0:6> and TANL<0:7>, which have been stored in the internal latches 48244 and 48246, as the test operation signal TM in response to the test set signal TMSET of the test setting signals TMSET and TMRESET generated from the test normal input block 420. In the state in which the operation control block 400 has entered the test public mode, the SR latch 48242 outputs the test public signals PUB_TCM<0:6> and PUB_TANL<0:7>, which have been stored in the internal latches 48244 and 48246, as the test operation signal TM in response to the input completion pulse TDIN_P generated from the pulse generation section 4842.

Figure 6:
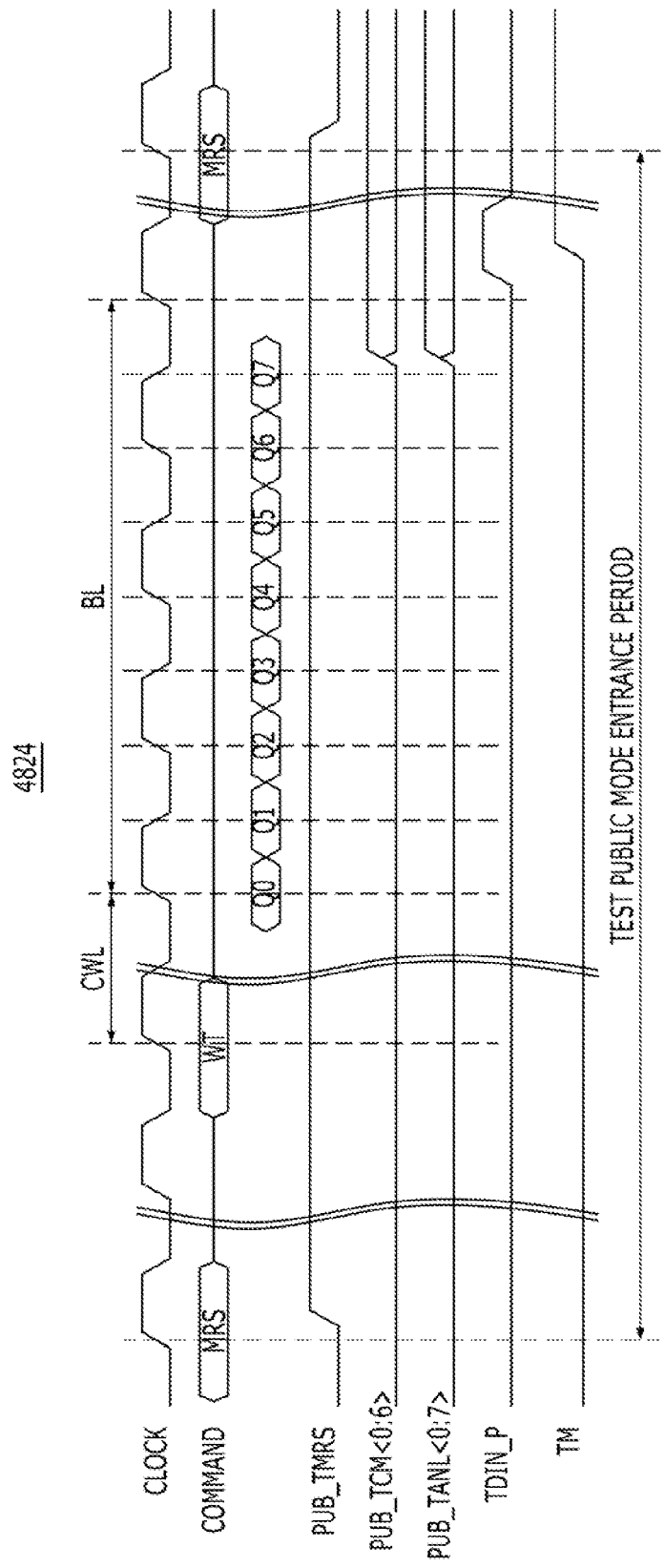
FIG. 6 is a timing diagram for explaining the operation of a circuit that performs a test mode operation using a MRS code in a semiconductor memory device illustrated in FIG. 4 in accordance with an embodiment of the present invention.

FIG. 6 is a timing diagram for explaining the operation of the test public mode of the operations of the circuit that performs the test mode operation using the MRS code in the semiconductor memory device illustrated in FIG. 4 in accordance with an embodiment of the present invention.

Referring to FIG. 6, in the circuit that performs the test mode operation using the MRS code in the semiconductor memory device in accordance with the embodiment of the present invention, the operation of the test public mode starts by activating the test public mode signal PUB_TMRS in response to the MRS command MRSCMD.

In the test public mode entrance period in which the test public mode signal PUB_TMRS has been activated, data signals DATA-Q1, Q2, Q3, Q4, Q5, Q6, and Q7 are inputted through the data pad 470 in response to the write command WTCMD. The inputted data signals DATA-Q1, Q2, Q3, Q4, Q5, Q6, and Q7 are parallelized at the time point at which serial input thereof has been ended, and are latched as the test public signals PUB_TCM<0:6> and PUB_TANL<0:7>. FIG. 6 illustrates that the number of the data signals DATA-Q1, Q2, Q3, Q4, Q5, Q6, and Q7 applied in response to the write command WTCMD is 8. However, this is for illustrative purposes only. Actually, a larger or smaller number of data signals DATA may be inputted. Furthermore, FIG. 4 illustrates that the data signals DATA are inputted through one data pad 470. However, this is for illustrative purposes only. Actually, a larger number of data pads 470 may be used.

Since many bits of the data signals DATA serially inputted through the data pad 470 may be easily received using a parallelization scheme, as compared with the address signal ADDRESS inputted through the address pad 460, the test public signals PUB_TCM<0:6> and PUB_TANL<0:7> may be received at one time as illustrated in FIG. 6 without dividing the test public signals PUB_TCM<0:6> and PUB_TANL<0:7> into upper signals PUB_TCM<0:6> and lower signals PUB_TANL<0:7>.

After all the test public signals PUB_TCM<0:6> and PUB_TANL<0:7> are inputted in response to the write command WTCMD and are latched, at a preset time, for example, when one cycle 1tck of a clock CLOCK has passed, the input completion pulse TDIN_P is pulsed. At the time point at which the input completion pulse TDIN_P is pulsed, it is determined whether to activate the test operation signal TM in response to the test public signals PUB_TCM<0:6> and PUB_TANL<0:7>.

In the state in which the operation control block 400 has entered the test public mode, after it is determined whether to activate the test operation signal TM, the operation control block 400 deactivates the test public mode signal PUB_TMRS in response to the MRS command MRSCMD, escapes from the test public mode, and enters the test application mode. At this time, a value of the test operation signal TM, which has been determined in the test public mode, is substantially maintained as is even after the operation control block 400 escapes from the test public mode and enters the test application mode. Accordingly, the test operation signal TM, the activation or deactivation of which has been determined in the test public mode, may have influence on the test operation for the internal circuit 440, which is performed in the state in which the operation control block 400 has entered the test application mode.

In the state in which the operation control block 400 has entered the test public mode, the reason why the data signals DATA inputted through the data pad 470 are available as signals for the test operation is because no data input/output operation of the semiconductor memory device is generated in the test public mode.

As described above, in the case in which the embodiment of the present invention is applied, in the semiconductor memory device that performs the test mode operation using the MRS code, when the MRS code is inputted, the data pad 470 may be used as well as the address pad 460.

Particularly, when the MRS code is inputted through the data pad 470, since a protocol generally used in the semiconductor memory device is used, such as the write command WTCMD, it is not necessary to define a separate specification (SPEC.) for the test operation from the exterior of the semiconductor memory device.

Accordingly, when an entrance method to the test public mode and a simple test code through a data input/output operation are provided, an external semiconductor controller or user may easily perform the test mode operation of the semiconductor memory device. Particularly, since a general semiconductor memory device data input/output protocol is used, the test operation may also be easily performed in a packaged semiconductor memory device.

Figure 7:
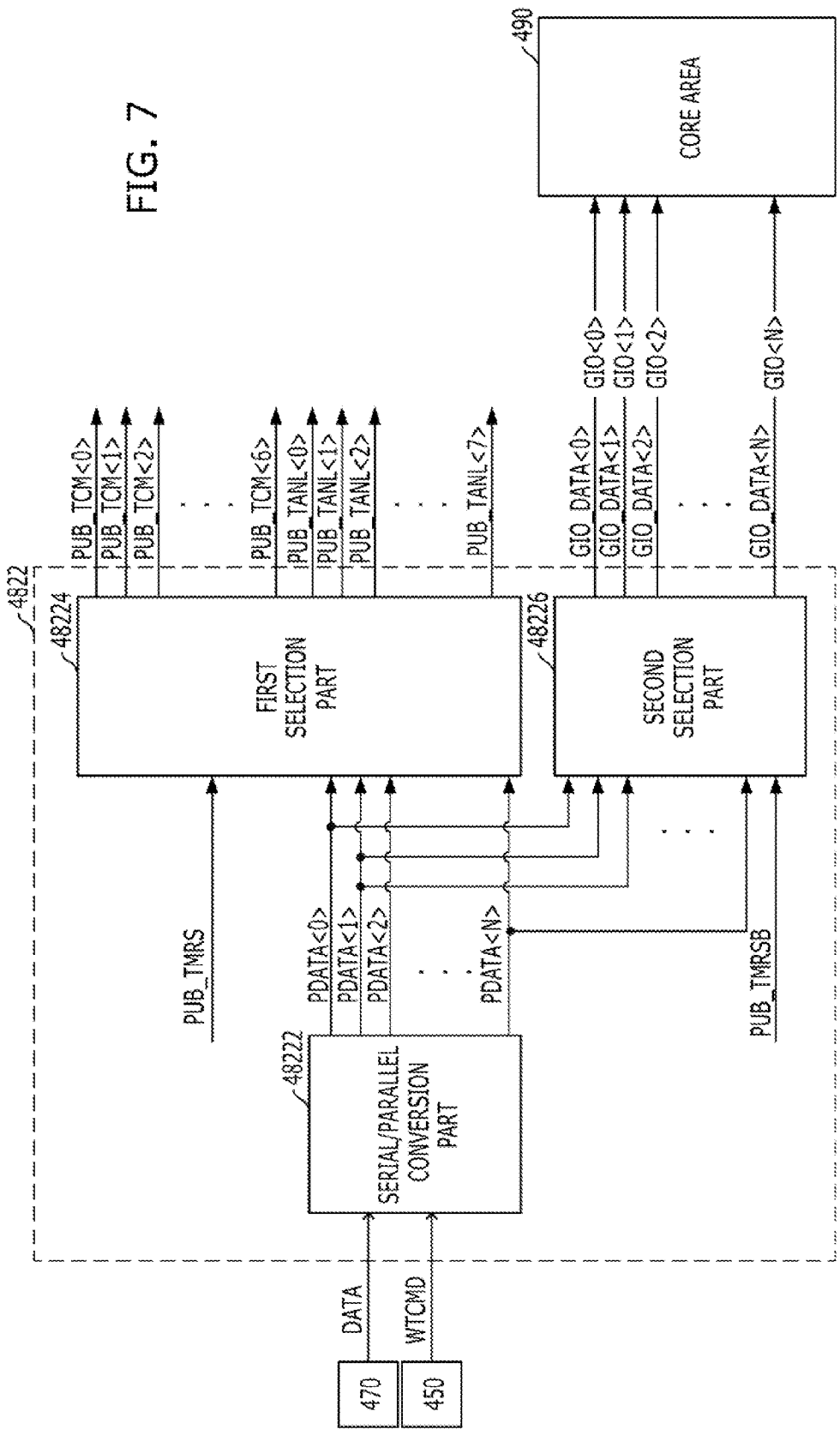
FIG. 7 is a detailed block diagram illustrating the configuration of a serial/parallel conversion section of elements of a circuit that performs a test mode operation using a MRS code in a semiconductor memory device illustrated in FIG. 4 in accordance with an embodiment of the present invention.

FIG. 7 is a detailed block diagram illustrating the configuration of the serial/parallel conversion section of the elements of the circuit that performs the test mode operation using the MRS code in the semiconductor memory device illustrated in FIG. 4 in accordance with the embodiment of the present invention.

Referring to FIG. 7, among the elements of the circuit that perform the test mode operation using the MRS code in the semiconductor memory device in accordance with the embodiment of the present invention, the serial/parallel conversion section 4822 included in the test public signal generation unit 482 includes a serial/parallel conversion part 48222, a first selection part 48224, and a second selection part 48226.

The serial/parallel conversion part 48222 receives the data signals DATA serially inputted to the data pad 470 and outputs parallelized data PDATA<0>, PDATA<1>, PDATA<2>, ..., PDATA<N> in response to the write command WTCMD.

The first selection part 48224 outputs the parallelized data PDATA<0>, PDATA<1>, PDATA<2>, ..., PDATA<N> as the test public signals PUB_TCM<0:6> and PUB_TANL<0:7> in response to the test public mode signal PUB_TMRS. That is, in the period in which the test public mode signal PUB_TMRS is activated and the operation control block 400 enters the test public mode, the first selection part 48224 outputs the parallelized data PDATA<0>, PDATA<1>, PDATA<2>, ..., PDATA<N> as the test public signals PUB_TCM<0:6> and PUB_TANL<0:7>. In contrast, in the period in which the test public mode signal PUB_TMRS is deactivated and the operation control block 400 escapes from the test public mode, the first selection part 48224 does not output the test public signals PUB_TCM<0:6> and PUB_TANL<0:7> regardless of the input of the parallelized data PDATA<0>, PDATA<1>, PDATA<2>, ..., PDATA<N>.

The second selection part 48226 outputs the parallelized data PDATA<0>, PDATA<1>, PDATA<2>, ..., PDATA<N> as global data GIO_DATA<0>, GIO_DATA<1>, GIO_DATA<2>, ..., GIO_DATA<N> in response to a signal obtained by inverting the phase of the test public mode signal PUB_TMRS. At this time, the global data GIO_DATA<0>, GIO_DATA<1>, GIO_DATA<2>, ..., GIO_DATA<N> is transferred to a core area 490 through global lines GIO<0>, GIO<1>, GIO<2>, ..., GIO<N>, and is stored therein. That is, in the period in which the test public mode signal PUB_TMRS is activated and the operation control block 400 enters the test public mode, the second selection part 48226 does not output the global data GIO_DATA<0>, GIO_DATA< >, GIO_DATA<2>, ..., GIO_DATA<N> regardless of the input of the parallelized data PDATA<0>, PDATA<1>, PDATA<2>, ..., PDATA<N>. In contrast, in the period in which the test public mode signal PUB_TMRS is deactivated and the operation control block 400 escapes from the test public mode, the second selection part 48226 outputs the parallelized data PDATA<0>, PDATA<1>, PDATA<2>, ..., PDATA<N> as the global data GIO_DATA<0>, GIO_DATA<1>, GIO_DATA<2>, ..., GIO_DATA<N>.

Figure 8:
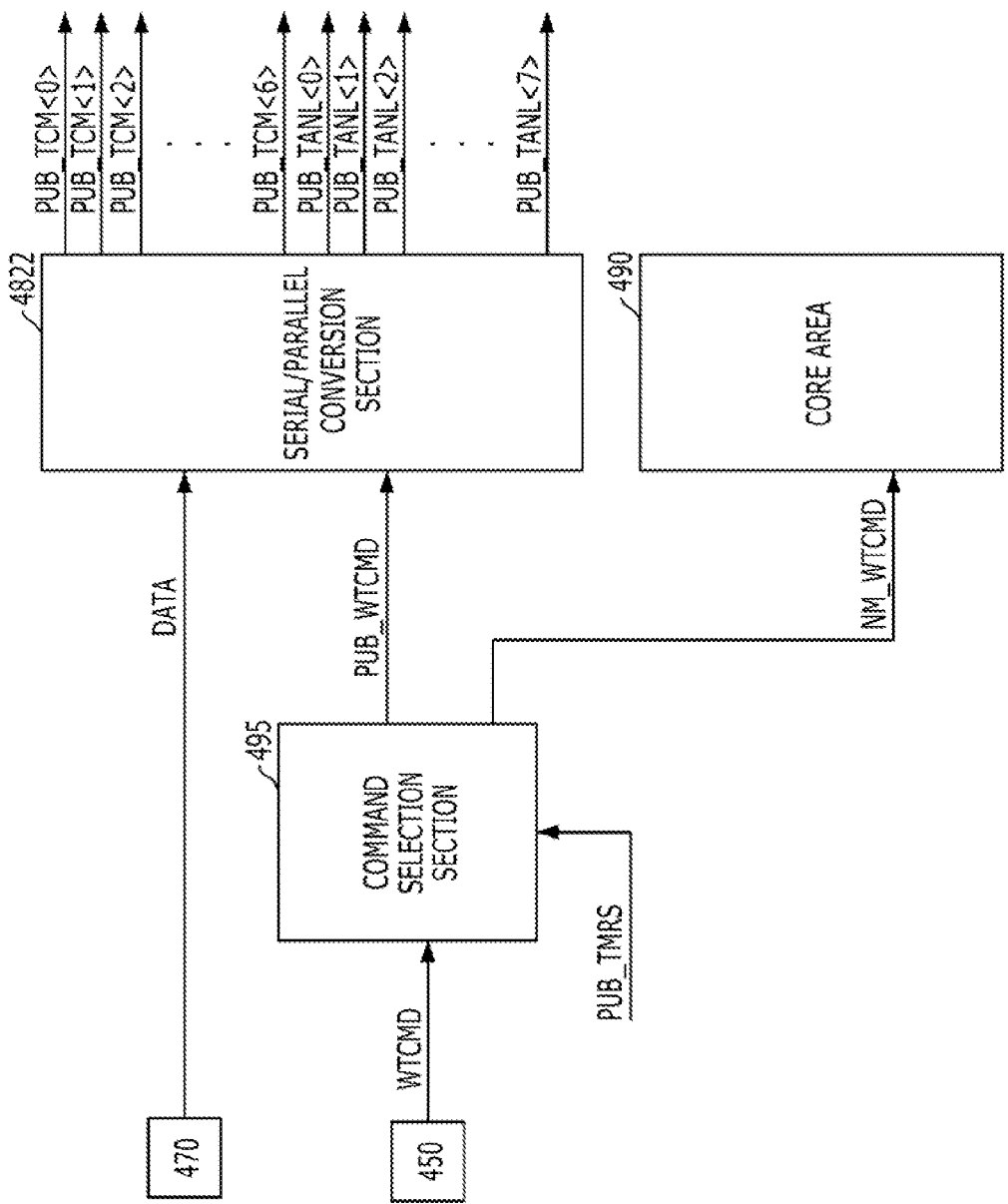
FIG. 8 is a block diagram including a command selection section selectively addable to a circuit that performs a test mode operation using a MRS code in a semiconductor memory device illustrated in FIG. 4 in accordance with an embodiment of the present invention.

FIG. 8 is a block diagram including a command selection section that may be included in the circuit that performs the test mode operation using the MRS code in the semiconductor memory device illustrated in FIG. 4 in accordance with the embodiment of the present invention.

The command selection section 495 selectively transfers the write command WTCMD, which is inputted through the command pad 450, to the serial/parallel conversion section 4822 as a public write command PUB_WTCMD or to the core area 490 as a normal write command NM_WTCMD in response to the test public mode signal PUB_TMRS.

That is, in the period in which the test public mode signal PUB_TMRS is activated and the operation control block 400 enters the test public mode, the command selection section 495 transfers the write command WTCMD to the serial/parallel conversion section 4822 as the public write command PUB_WTCMD, and does not generate the normal write command NM_WTCMD at this time. Accordingly, in the entrance period of the test public mode, the core area 490 receives neither the global data GIO_DATA<0>, GIO_DATA<1>, GIO_DATA<2>, ..., GIO_DATA<N> due to the configuration of the serial/parallel conversion section 4822 illustrated in FIG. 7, nor the normal write command NM_WTCMD due to the operation of the command selection section 495. That is, in the entrance period of the test public mode, no operations are completely performed in the core area 490.

In contrast, in the period in which the test public mode signal PUB_TMRS is deactivated and the operation control block 400 escapes from the test public mode, the command selection section 495 transfers the write command WTCMD to the core area 490 as the normal write command NM_WTCMD, and does not generate the public write command PUB_WTCMD at this time. Accordingly, in the escape period of the test public mode, the core area 490 receives the global data GIO_DATA<0>, GIO_DATA<1>, GIO_DATA<2>, ..., GIO_DATA<N> due to the configuration of the serial/parallel conversion section 4822 illustrated in FIG. 7, and also receives the normal write command NM_WTCMD due to the operation of the command selection section 495. That is, in the escape period of the test public mode, a normal data write operation is performed in the core area 490.

As described above, the command selection section 495 may be used as an element for assisting the operation of the serial/parallel conversion section 4822 illustrated in FIG. 7, but may not be used according to the selection of a designer. This is because the input of the data signals DATA may be controlled depending on entrance/escape to/from the test public mode through only the operation of the serial/parallel conversion section 4822.

Although various embodiments have been described for illustrative purposes, it will be apparent to those skilled in the art that various changes and modifications may be made without departing from the spirit and scope of the invention as defined in the following claims.

For example, the aforementioned embodiment has described a method using the write command WTCMD in order to receive the data signals DATA through the data pad 470. However, this is for illustrative purposes only. As well as the write command WTCMD, other commands generally used in a semiconductor memory device, such as a read command or an active command, may be used.

In the aforementioned embodiment, the number of bits of the MRS code is limited to 7 bits (<0:6>) or 8 bits (<0:7>). However, this is for illustrative purposes only. The number of bits of the MRS code may be expressed by a larger or smaller number of bits.

Furthermore, the position and type of a logic gate and a transistor may be changed based on the polarity of an inputted signal.

What is claimed is:

1. A semiconductor memory device comprising:
an operation control block suitable for controlling an entrance/escape to/from a test public mode and a test application mode in response to a first preset command and an address signal that is inputted through an address pad;
a test normal input block suitable for receiving the address signal as a test operation signal in response to the first preset command in the test application mode;
a test public input block suitable for receiving a data signal, which is inputted through a data pad, as the test operation signal in response to a second preset command in the test public mode; and
an internal circuit suitable for performing a preset test operation in response to the test operation signal in the test application mode.

2. The semiconductor memory device of claim 1, wherein:
the operation control block enters the test application mode when a first value of the address signal is inputted in response to the first preset command after power-up;
the operation control block escapes from the test application mode and enters the test public mode when a second value of the address signal is inputted in response to the first preset command in the test application mode;
the operation control block escapes from the test public mode and enters the test application mode when a third value of the address signal is inputted in response to the first preset command in the test public mode; and
the operation control block escapes from the test application mode when a fourth value of the address signal is inputted in response to the first preset command in the test application mode.

3. The semiconductor memory device of claim 2, wherein the test public input block comprises:
a test public signal generation unit suitable for generating a test public signal based on the data signal in response to the second preset command in the test public mode; and
a test public application unit suitable for transferring the test public signal.

4. The semiconductor memory device of claim 3, wherein the test public signal generation unit comprises:

a serial/parallel conversion section suitable for parallelizing the data signal in response to the second preset command in the test public mode, and generating the test public signal; and
a latch section suitable for latching the test public signal that is transferred from the test public application unit in a parallel manner and for transferring the test public signal when a preset time lapses from when an operation of the test public signal generation unit ends in the test public mode.

5. The semiconductor memory device of claim 4, wherein the test public application unit comprises:
a pulse generation section suitable for generating an input completion pulse that is pulsed when the preset time lapses after the data signal is inputted to the serial/parallel conversion section in the test public mode; and
a test public output section suitable for controlling that latch section transfers the test public signal and the input completion pulse to the latch section.

6. The semiconductor memory device of claim 5, wherein the test normal input block comprises:
a normal signal generation unit suitable for selectively generating a test normal signal or a test setting signal based on the address signal in response to the first preset command in the test application mode; and
a test normal application unit suitable for controlling that latch section transfers the test normal signal and the test setting signal to the latch section in the test application mode.

7. The semiconductor memory device of claim 6, wherein:
the normal signal generation unit generates the test normal signal based on the address signal in response to the first preset command applied firstly in the test application mode; and
the normal signal generation unit generates the test setting signal based on the address signal in response to the first preset command applied secondly in the test application mode.

8. The semiconductor memory device of claim 7, wherein:
the test normal application unit receives the test normal signal generated from the normal signal generation unit and stores the test normal signal in the latch section.

9. The semiconductor memory device of claim 1, wherein the first preset command includes a MRS (mode register set) command.

10. The semiconductor memory device of claim 1, wherein the second preset command includes a write command.

11. A method for operating a semiconductor memory device, comprising:
entering a test application mode based on an address signal that is inputted through an address pad in response to a first preset command after power-up;
escaping from the test application mode and entering a test public mode based on the address signal in response to the first preset command in the test application mode;
generating a test operation signal based on a data signal that is inputted through a data pad in response to a second preset command in the test public mode;
escaping from the test public mode and entering the test application mode based on the address signal in response to the first preset command in the test public mode; and
applying a preset test operation to an internal circuit in response to the test operation signal in the test application mode.

12. The method of claim 11, further comprising, in the test application mode:

generating the test operation signal based on the address signal in response to the first preset command.

13. The method of claim 12, wherein the generating of the test operation signal based on the data signal comprises:
generating a test public signal based on the data signal in response to the second preset command in the test public mode; and
outputting the test public signal as the test operation signal when a preset time lapses from when the generation of the test public signal ends.

14. The method of claim 13, wherein the generating of the test public signal comprises:
parallelizing the data signal to generate the test public signal; and
latching the test public signal that is parallelized.

15. The method of claim 14, wherein the outputting of the test public signal as the test operation signal comprises:
generating an input completion pulse that is pulsed when the preset time lapses after the data signal is applied in the generating of the test public signal; and
outputting the test public signal, which is latched, as the test operation signal in response to pulsing of the input completion pulse.

16. The method of claim 13, wherein the generating of the test operation signal based on the address signal comprises:
selectively generating a test normal signal or a test setting signal based on the address signal in response to the first preset command in the application mode; and
outputting the test normal signal as the test operation signal in response to the test setting signal.

17. The method of claim 16, wherein the selectively generating of the test normal signal or the test setting signal comprises:
generating the test normal signal based on the address signal in response to the first preset command applied firstly in the test application mode; and
generating the test setting signal based on the address signal in response to the first preset command applied secondly in the test application mode.

18. The method of claim 17, wherein the outputting of the test normal signal as the test operation signal comprises:
latching the test normal signal generated in the generating of the test normal signal; and
outputting the test normal signal that is latched as the test operation signal in response to the test setting signal generated in the generating of the test setting signal.

19. The method of claim 11, wherein the first preset command includes a MRS (mode register set) command.

20. The method of claim 11, wherein the second preset command includes a write command.

21. A semiconductor memory device comprising:
an operation control block suitable for generating a test application signal and a test public mode signal indicating a test application mode and a test public mode, respectively, in response to a first command and an address signal inputted through an address pad in response to the first command;
a test normal input block suitable for generating a test operation signal based on the address signal in response to the test application signal;
a test public input block suitable for generating the test operation signal based on a data signal, which is inputted through a data pad in response to a second command, in response to the test public mode signal; and
an internal circuit suitable for performing a test operation in response to the test operation signal.

22. The semiconductor memory device of claim 21, wherein the test public input block comprises:
a serial/parallel conversion section suitable for parallelizing the data signal to generate a test public signal in response to the second command;
a latch section suitable for latching the test public signal; and
a test public application unit suitable for generating an input completion pulse for the latch section to output the test public signal as the test operation signal when a preset time lapses after the data signal is inputted to the serial/parallel conversion section.

* * * * *